United States Patent
Diberardino et al.

(10) Patent No.: US 7,132,735 B2
(45) Date of Patent: Nov. 7, 2006

(54) INTEGRATED CIRCUIT PACKAGE WITH LEAD FINGERS EXTENDING INTO A SLOT OF A DIE PADDLE

(75) Inventors: Michael F. Diberardino, North Wales, PA (US); Lawrence Wayne Golick, Nazareth, PA (US); Xingling Zhou, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 52 days.

(21) Appl. No.: 11/074,358

(22) Filed: Mar. 7, 2005

(65) Prior Publication Data

US 2006/0197195 A1 Sep. 7, 2006

(51) Int. Cl.
*H01L 23/495* (2006.01)
*H01R 9/00* (2006.01)

(52) U.S. Cl. ........... 257/676; 257/692; 257/773; 257/784; 361/772; 361/812

(58) Field of Classification Search ............ None
See application file for complete search history.

(56) References Cited

U.S. PATENT DOCUMENTS 6,639,306 B1 * 10/2003 Huang .................. 257/667
6,650,020 B1 * 11/2003 Yamada et al. ........... 257/783
2006/0035414 A1 * 2/2006 Park et al. .............. 438/124

FOREIGN PATENT DOCUMENTS

JP 06268143 A * 9/1994

* cited by examiner

*Primary Examiner*—Alonzo Chambliss

(57) ABSTRACT

The specification describes a leadframe that is aimed at high-performance digital IC devices with high-pin counts, and packaged using wire bond technology. According to the invention the configuration of the paddle is modified to add a new dimension to the leadframe design. In a preferred embodiment, one or more slots are formed in the paddle to allow the length of selected wire bonds to be reduced. This reduces the susceptibility of these selected leads to parasitic capacitances. The selected leads are typically those that carry very high-speed signals.

18 Claims, 6 Drawing Sheets

INTEGRATED CIRCUIT PACKAGE WITH LEAD FINGERS EXTENDING INTO A SLOT OF A DIE PADDLE

FIELD OF THE INVENTION

The field of the invention is integrated circuit (IC) packaging and more specifically to design of leadframes for overmolded wire-bonded IC packages.

BACKGROUND OF THE INVENTION

Wire-bonding technology for integrated circuit packages remains a staple in IC manufacturing. For high pin count devices with fine pitch it allows an element of precision that is difficult to match with flip-chip solder bump technology. Typical high-pin count packages, for example thin quad flat pack TQFP packages, have a square or rectangular paddle, on which the IC chip is bonded, with leads extending from the four sides. The leads are typically fanned out to transition the lead pitch from very fine at the IC chip, to a wider pitch at the wire bond sites, and even wider pitch at the interconnection sites, i.e. the lead ends. In state-of-the-art high-speed digital devices the length and configuration of the wire bonds and the leadframe fingers to which the wire bonds are attached adds a circuit element that needs to be controlled for optimum performance. A variety of leadframe designs have been developed to address these issues but improvements are continually sought.

STATEMENT OF THE INVENTION

We have designed a new leadframe, and IC package, that is aimed at high-performance digital IC devices with high-pin counts, and packaged using wire-bond technology. According to the invention the configuration of the paddle is modified to add a new dimension to the leadframe design. In a preferred embodiment, one or more slots are formed in the paddle to allow the length of selected wire bonds to be reduced. This minimizes the susceptibility of the wire bonds to these selected leads to parasitic resistances/inductances. The selected leads are typically those that carry very high-speed digital signals.

DETAILED DESCRIPTION

The invention will be illustrated and described using an exposed paddle thin quad flat pack IC package (eTQFP) as a prototype. However, it should be understood that the invention is not so limited. It may apply to a variety of wire-bonded IC devices. Typically these will be overmolded plastic packages, as in the example illustrated here, or may be plastic cavity packages, or any other type of high pin count packaging. Also to be considered within the scope of the invention are IC or electrical component packages in which the paddle configuration is modified to influence other aspects of the electrical performance of the device. The package may contain hybrid ICs or integrated passive device (IPD) chips. It may contain optical sub-assemblies such as MEMS devices packaged with digital chips.

Figure 1:
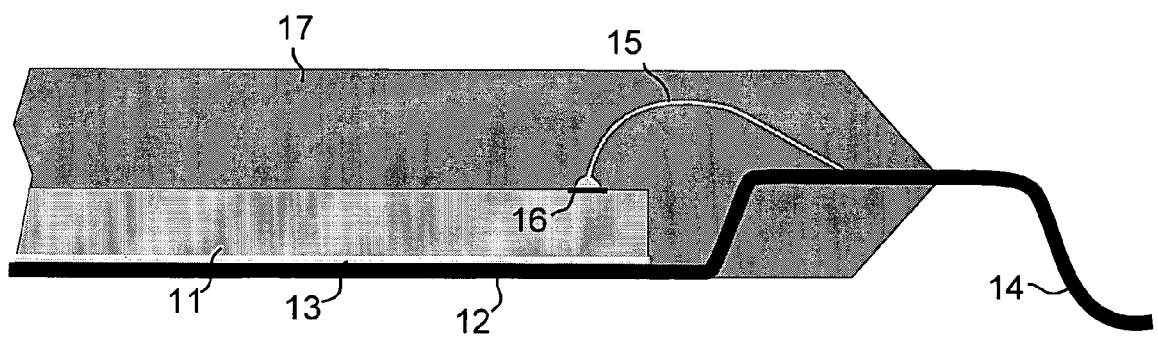
FIG. 1 is a section view of a conventional TQFP IC package.

With reference to FIG. 1, a semiconductor chip 11 is shown bonded to a leadframe. The leadframe comprises paddle 12 with solder, or conductive adhesive, 13 as the medium for bonding the chip to the paddle. In this package design the paddle is exposed on the bottom of the package to allow a ground I/O connection to be made directly to the exposed paddle. The paddle also comprises a lead finger 14 extending from the side of the package. This form of semiconductor device package is characterized by wire bonds 15 bonded between bond pads 16 on the IC chip and leads 14. FIG. 1 also shows the usual plastic encapsulant 17.

Figure 2:
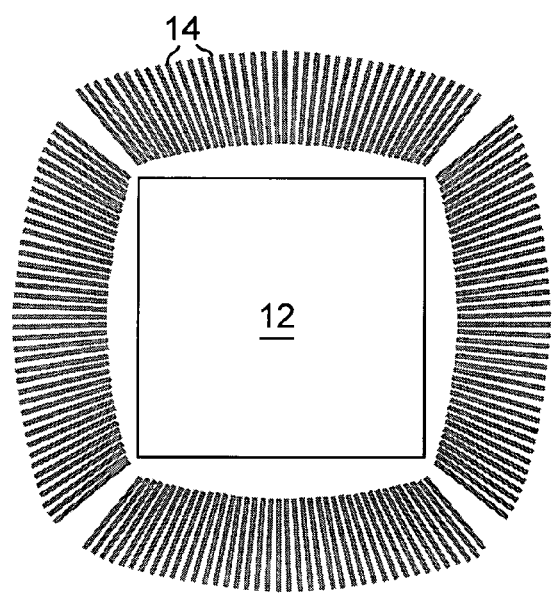
FIG. 2 is a schematic plan view of a typical leadframe design for the device of FIG. 1.

FIG. 2 is a plan view of the leadframe of FIG. 1 that schematically shows the organization of the lead fingers 14 that extend away from paddle 12. The leads in this design are fanned for the reason described above. The fanned array also provides approximately equal wire bonds lengths. The paddle 12 typically has square shape, with four edges as shown. In the general case the paddle has a quadrilateral shape, with length L, width W, and four edges. In FIG. 2, the plurality of lead fingers extends from the paddle along the four edges. Other designs are possible, but the lead fingers will usually extend from at least two edges.

Figure 3:
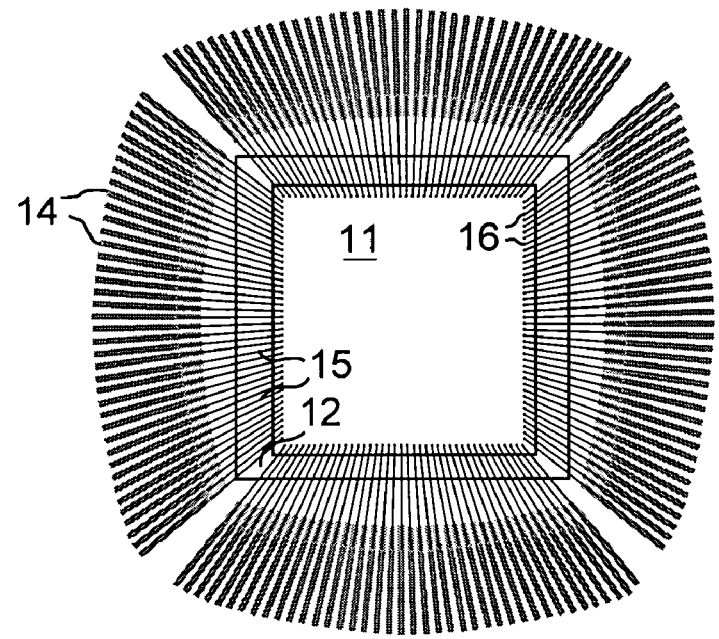
FIG. 3 is a plan view showing the leadframe of FIG. 2 after die bonding and wire bonding the IC chip.

FIG. 3 shows the leadframe of FIG. 2 with the IC chip die bonded to paddle 12. The IC chip in this design has a square shape but, again, in the general case the IC chip has a quadrilateral shape with length L', width W', wherein L' is less than L (of the paddle) and W' is less than W, and wherein the IC chip substantially covers the paddle except for the exposed regions along the edge of the paddle. (The exposed regions are a consequence of L' and W' being less than L and W respectively.) FIG. 3 also shows the wire bonds 15 between the IC chip and the leads 14. Due to the fanning of the lead fingers as described above, and the curved configuration of the array of lead fingers, the length of all of the wire bonds in the array is approximately equal.

Figure 4:
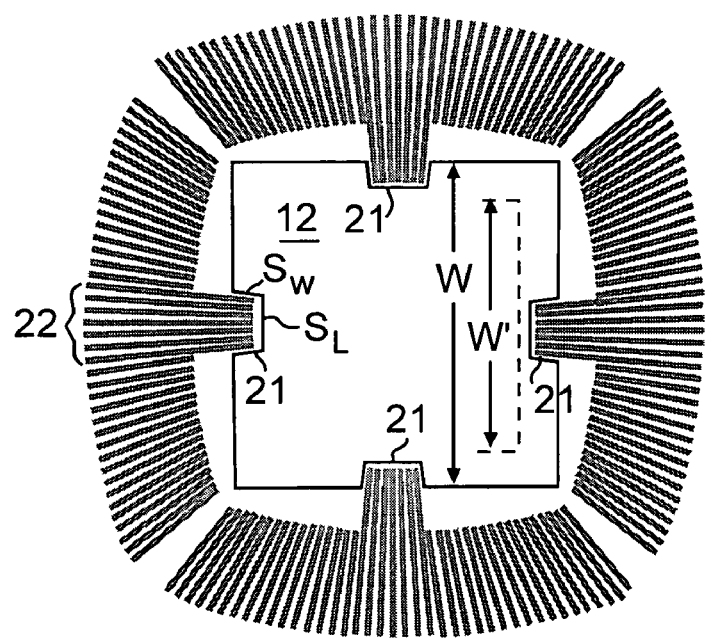
FIG. 4 is a schematic plan view of a leadframe with a modified paddle geometry illustrating one embodiment of the invention.

FIG. 4 illustrates one embodiment of the invention. The paddle 12 is provided with one or more slots 21. FIG. 4 shows four slots 21 symmetrically placed one on each side of paddle 12. However, there may be any number of slots, and they may be positioned at any place on the edge of the paddle. The center location is preferred because the slot geometry essentially matches the shape of the array of extended lead fingers. The slots will typically have a width $S_L$, as measured along the length L (or width) of the paddle, that is substantially less than L, normally less than 0.25L. The width of the slot $S_W$ preferably occupies most of the space allowed by the difference W–W', for example, at least 50% and preferably 75% of W–W'.

The slots 21 accommodate a selected group of two or more lead fingers 22 that extend into the slots as shown in FIG. 4. This allows the wire bonds from the IC chip to the selected group of lead fingers to have substantially reduced length.

Figure 5:
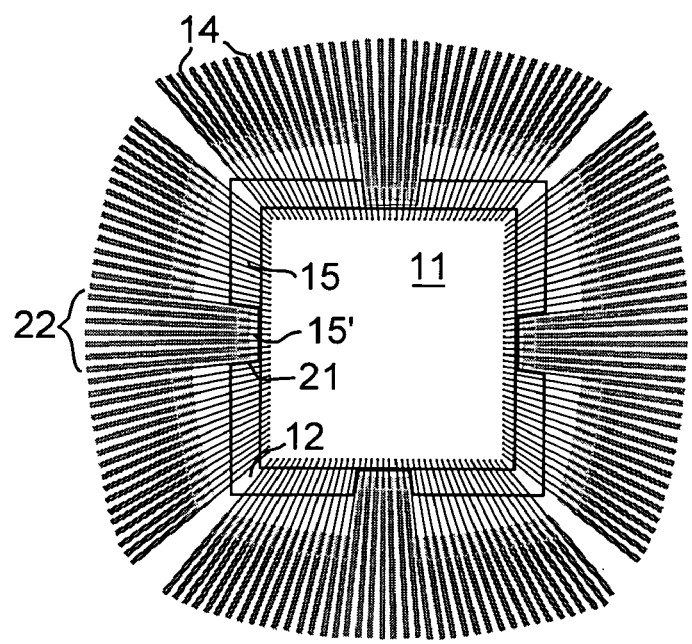
FIG. 5 is a plan view showing the leadframe of FIG. 4 after die bonding and wire bonding the IC chip.
Figure 6:
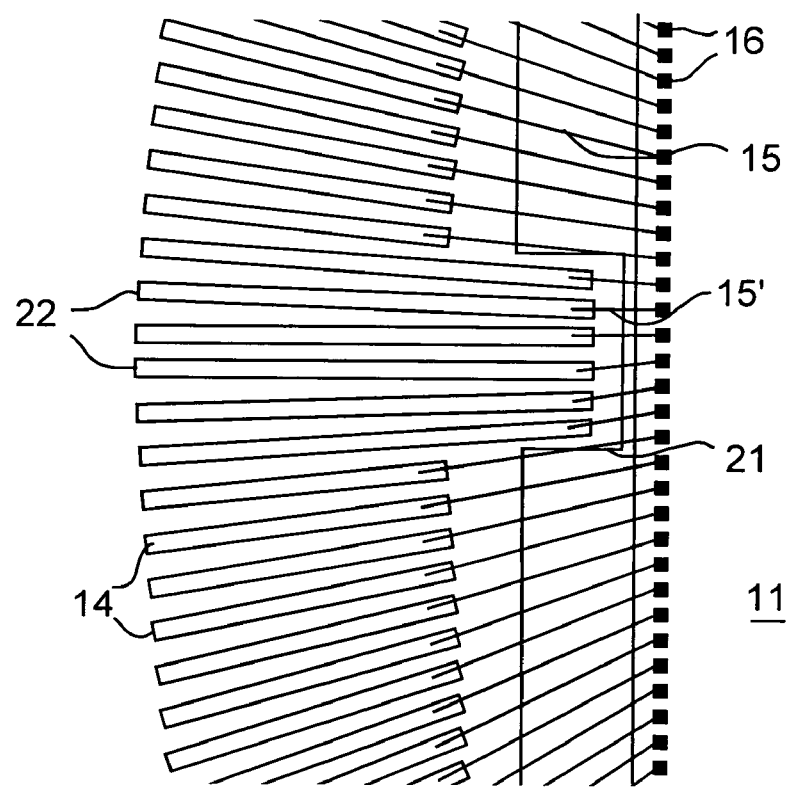
FIG. 6 is a detailed view of the slot portion of FIG. 5.

FIGS. 5 and 6 illustrate this in more detail. FIG. 5 shows the leadframe of FIG. 4 with the IC chip 11 attached and the wire bonds 15 bonded between the IC chip and lead fingers 14. The selected group of lead fingers 22 extends into slot 21 as shown. Wire bonds 15' have a length substantially shorter than wire bonds 15 to the conventional lead fingers, i.e. those that do not extend into a slot. In the preferred embodiment, the length of wire bonds 15' is less than one-half of the length of the wire bonds 15. In some cases it may be convenient to not use rectangular slots, but rather to slope the sidewalls of one or more slots to match the shape of the array of extended lead fingers in the region where the lead fingers extend within a slot.

From the description above and from FIGS. 4–6 it is evident that the selected group of lead fingers 22 is substantially less than the overall number of lead fingers in the package. As shown in FIG. 4, there is a total of 160 lead fingers in the package, of which 28, or 17.5%, are extended according to the teachings of the invention. Obviously that percentage may be larger or smaller. Typically it will fall in a range of about 3–30%.

Figure 7:
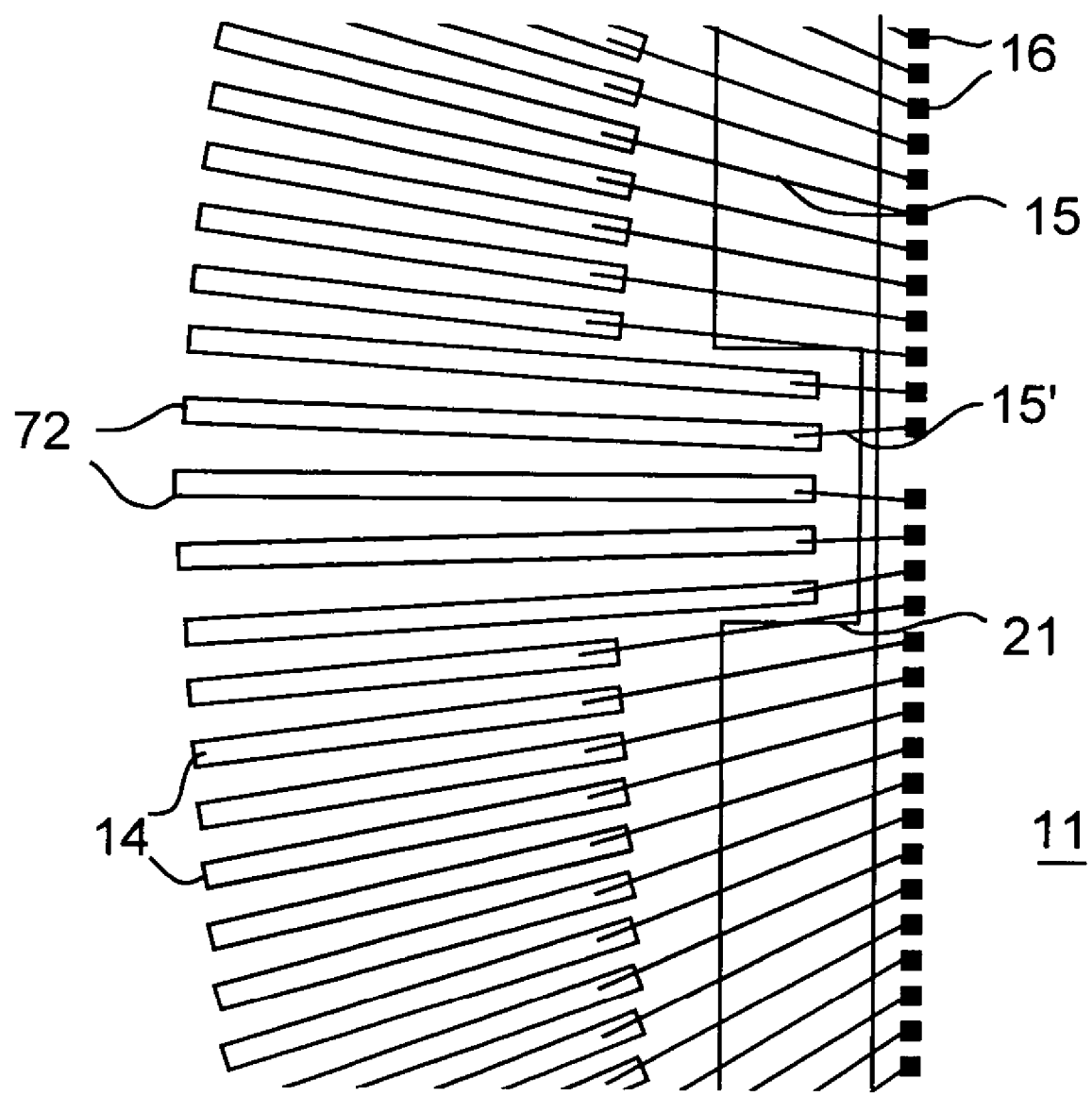
FIGS. 7–9 show different embodiments for the configuration of the selected leads that extend into the slot.

On examination of FIGS. 5 and 6, it will occur to those skilled in the art that if the pitch of all the fingers at the outer ends of the fingers, i.e. the outer edge of the fan array, is approximately the same, then the portion of the lead fingers that extends into the slot (the inner end of those fingers) will have a pitch less than the pitch at the inner end of the lead fingers that are not extended. This follows since all the lead fingers converge, and the lead fingers that extend into the slot are longer. Accordingly, it may be advantageous to adjust the spacing of the extended lead fingers to a pitch different from the pitch of the shorter lead fingers. An embodiment of this is shown in FIG. 7, where the extended lead fingers 72, i.e. the lead fingers that extend into the slot, have a pitch at their outer end that is larger than the pitch at the outer end of the shorter lead fingers 14. This results in the pitch of the extended lead fingers as they extend into the slot being approximately equal to the pitch at the inner end of the shorter fingers 14. This expedient may be needed where the pitch at the inner end of all the lead fingers meets a minimum design rule.

Figure 8:
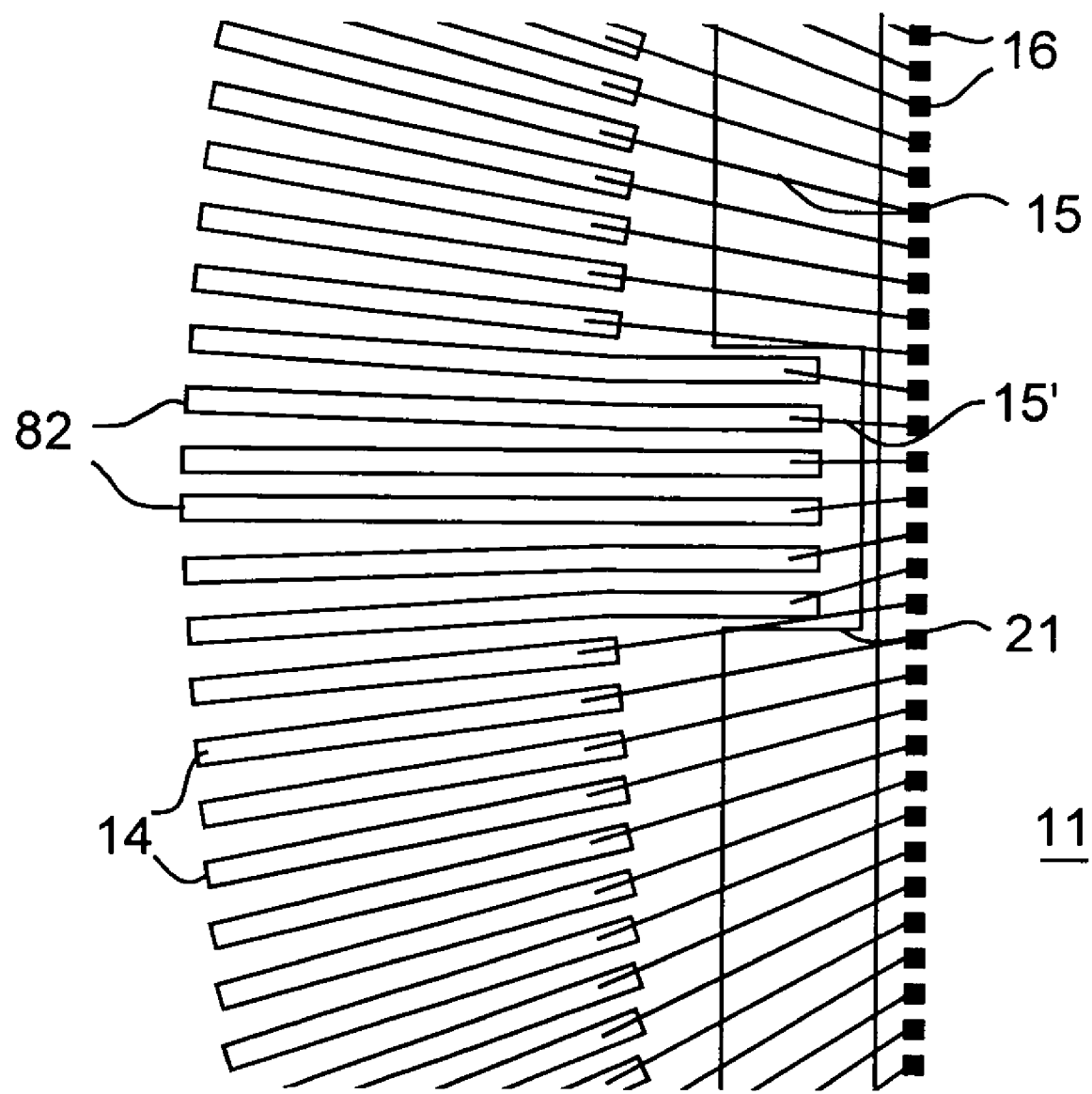

Another alternative design is shown in FIG. 8. Here some of the extended lead fingers 82 are bent in a way that preserves the pitch of the inner ends of those lead fingers at a pitch that matches the pitch of the inner ends of the other lead fingers 14 in the array.

Figure 9:
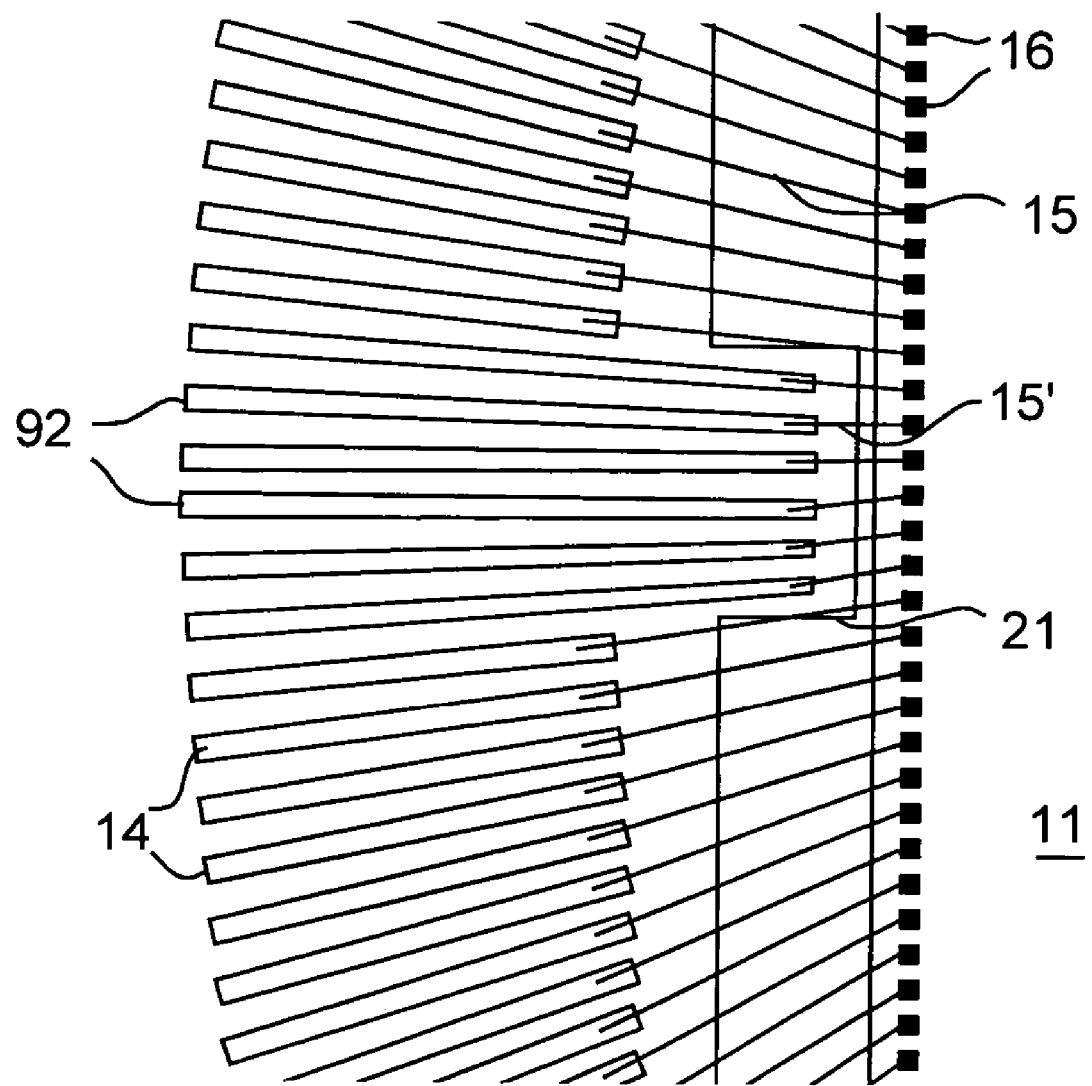

It may occur to those skilled in the art that by extending the length of selected lead fingers, the impedance of those fingers will change. To address this, according to the invention, the shape of the lead fingers is modified. An example of this is shown in FIG. 9, where the extended lead fingers 92 are tapered to adjust the impedance of the extended lead fingers.

It should be pointed out that any of the expedients described above may be used in alone, or in any suitable combination.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. A integrated circuit package comprising:
   a leadframe having a paddle, the paddle having at least one edge with a slot formed therein;
   an integrated circuit chip secured to the paddle; and
   a plurality of lead fingers having a distal end adjacent to the paddle along the at least one edge, the distal end of a subset of the lead fingers extending into the slot, whereby a wire bond extending from a bond pad on the chip to the distal end of a lead finger extending into the slot is shorter than a wire bond extending from a bond pad on the chip to the distal end of a lead finger that does not extend into the slot.

2. An integrated circuit package comprising:
   a. a leadframe having a paddle, the paddle having a quadrilateral shape, with length L, width W, and having four edges,
   b. a plurality P+P' of lead fingers extending from the paddle along at least two edges, where P' is less than P,
   c. an IC chip attached to the paddle, the IC chip having a quadrilateral shape with length L', width W', and having four edges, wherein L' is less than L and W' is less than W, and wherein the IC chip substantially covers the paddle except for at least one exposed region along the edge of the paddle,
   the invention characterized by at least one slot formed in said exposed region, and wherein the plurality P' of lead fingers extend into the slot.

3. The device of claim 2 further comprising wire bonds of length X attached to the plurality P of lead fingers, and wire bonds of length X' attached to the plurality P' of lead fingers, and wherein X' is substantially less than X.

4. The device of claim 3 wherein X' is less than 50% of X.

5. The device of claim 3 wherein the IC chip is a digital IC chip, and the plurality of leads P' are selected high speed digital I/O leads.

6. The device of claim 3 wherein the slot has a length of less than 0.25L.

7. The device of claim 6 wherein the slot has a width of at least 0.50 (W–W').

8. The device of claim 3 wherein L and W are substantially equal.

9. The device of claim 3 wherein the lead fingers P have pitch p and the lead fingers P' have pitch p', where p' is larger than p.

10. The device of claim 3 wherein at least some of the lead fingers P are bent.

11. The device of claim 3 wherein at least some of the lead fingers 3 are tapered.

12. The device of claim 3 wherein the slot has tapered sidewalls.

13. A leadframe on which to secure an integrated circuit chip, to wire bond from bond pads on the integrated circuit chip to lead frame fingers, and overmold to form an integrated circuit, the leadframe comprising:
   a leadframe having a paddle on which the integrated circuit chip is adapted to be secured, the paddle having at least one edge with a slot formed therein; and
   a plurality of lead fingers, each lead finger having a distal end adjacent to the paddle along the at least one edge, the distal end of a subset of the lead fingers extending into the slot, whereby when a wire bond is completed from a bond pad on the chip to the distal end of a lead finger extending into the slot such wire bond will be shorter than a wire bond completed from a bond pad on the chip to the distal end of a lead finger that does not extend into the slot.

14. A integrated circuit package leadframe comprising:
   a. a leadframe having a paddle, the paddle having a quadrilateral shape, with length L, width W, and having four edges,
   b. a plurality P+P' of lead fingers extending from the paddle along at least two edges, where P' is less than P, the invention characterized by at least one slot formed in one edge of the leadframe, and wherein the plurality P' of lead fingers extend into the slot.

15. The leadframe of claim 14 wherein the slot has a length of less than 0.25L.

16. The leadframe of claim 14 wherein L and W are substantially equal.

17. The leadframe of claim 14 wherein the lead fingers P have pitch p and the lead fingers P' have pitch p', where p' is larger than p.

18. The leadframe of claim 14 wherein at least some of the lead fingers are tapered.

* * * * *